United States Patent
Okamura et al.

(10) Patent No.: US 7,338,716 B2
(45) Date of Patent: Mar. 4, 2008

(54) LAMINATE AND PROCESS FOR PRODUCING THE SAME

(75) Inventors: Kazuto Okamura, Chiba (JP); Kazutoshi Taguchi, Chiba (JP); Kazunori Ohmizo, Chiba (JP); Makoto Shimose, Chiba (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/467,463

(22) PCT Filed: Feb. 25, 2002

(86) PCT No.: PCT/JP02/01317

§ 371 (c)(1),
(2), (4) Date: Nov. 17, 2003

(87) PCT Pub. No.: WO02/064363

PCT Pub. Date: Aug. 22, 2002

(65) Prior Publication Data

US 2004/0067349 A1   Apr. 8, 2004

(30) Foreign Application Priority Data

Feb. 16, 2001   (JP)   ............... 2001-040828

(51) Int. Cl.
*B32B 9/00* (2006.01)
(52) U.S. Cl. ............... 428/473.5; 428/209; 428/212; 428/213; 428/214; 428/458; 156/308.2; 156/309.9
(58) Field of Classification Search ............... 428/209, 428/344, 355 R, 212, 213–214, 458, 473.5; 156/308.2, 309.9
See application file for complete search history.

(56) References Cited

U.S. PATENT DOCUMENTS

| | | | | |
|---|---|---|---|---|
| 4,670,325 A | * | 6/1987 | Bakos et al. | 428/209 |
| 5,130,192 A | * | 7/1992 | Takabayashi et al. | 428/332 |
| 5,262,227 A | * | 11/1993 | Takabayashi et al. | 428/215 |
| 5,374,469 A | * | 12/1994 | Hino et al. | 428/209 |
| 5,578,696 A | * | 11/1996 | Mochizuki et al. | 528/353 |
| 5,741,598 A | * | 4/1998 | Shiotani et al. | 428/458 |
| 6,379,784 B1 | * | 4/2002 | Yamamoto et al. | 428/216 |

FOREIGN PATENT DOCUMENTS

| | | |
|---|---|---|
| JP | 06-275928 A1 | 9/1994 |
| JP | 08-150687 A1 | 6/1996 |
| JP | 08-230101 A1 | 9/1996 |
| JP | 11-157026 A1 | 6/1999 |
| JP | 2000-177051 A1 | 6/2000 |
| WO | WO-98/08216 A1 | 2/1998 |

OTHER PUBLICATIONS

International Search Report for PCT/JP02/01317 mailed on May 28, 2002.
Notification of Transmittal of Copies of Translation of the International Preliminary Examination Report for PCT/JP02/01317 mailed on Dec. 10, 2003.

\* cited by examiner

*Primary Examiner*—Cathy F. Lam
(74) *Attorney, Agent, or Firm*—Cheng Law Group PLLC

(57) ABSTRACT

This invention relates to a laminate comprising an insulating polyimide resin layer etchable by an aqueous alkaline solution and a metal foil. The laminate has an insulating resin layer composed of a plurality of polyimide resin layers on the metal foil and the insulating resin layer has at least one polyimide resin layer (A) with a coefficient of linear thermal expansion (CTE) of $30 \times 10^{-6}/°$ C. or less and at least one polyimide resin layer (B) with a glass transition temperature (Tg) of 300° C. or below, the layer in contact with the metal foil is the polyimide resin layer (B), the bonding strength between the metal foil and the polyimide resin layer (B) in contact therewith is 0.5 kN/m or more, and the average rate of etching of the insulating resin layer by a 50 wt % aqueous solution of potassium hydroxide at 80° C. is 0.5 μm/min or more. The laminate is useful for flexible printed circuits and the like.

20 Claims, No Drawings

LAMINATE AND PROCESS FOR PRODUCING THE SAME

FIELD OF TECHNOLOGY

This invention relates to laminates useful for the substrates of flexible printed circuits and HDD suspensions and to a process for manufacturing the same.

BACKGROUND TECHNOLOGY

Laminates to be used in the substrates of printed circuits and HDD suspensions have been manufactured by pasting polyimide or polyester films to metal foils by means of an adhesive based on epoxy or acrylic rein. However, laminates manufactured in this manner show poor heat resistance because of the presence of an adhesive layer and, when subjected to a heat treatment, undergo dimensional changes to such an extent as to hinder the following steps. To solve this problem, laminates composed of metal foils and polyimide resins exhibiting good adhesiveness to metal foils and high heat resistance have been devised as disclosed in JP 5-22399 B. However, laminates composed of those polyimide resins which possess the aforementioned properties are generally processed by dry etching by the ultraviolet laser or plasma process and this practice has causes problems such as costly equipment, high running cost including the cost of gases to be used and poor quality for mass production.

Under the circumstances, materials processible by wet etching with organic alkalis or aqueous solutions of inorganic alkalis as etchants have been in demand as substitutes for materials processible by the aforementioned dry etching. However, the use of organic alkalis such as hydrazine presents a problem of high toxicity. Typical materials processible by wet etching with an aqueous alkaline solution are polyimide resins Kapton of duPont and Apical of Kaneka Corporation and the processing technique proposed for these polyimide resins consists of directly plating the resins with metals and etching the plated resins in an arbitrary shape. This technique, however, faces problems such as an increased number of processing steps and poor dimensional accuracy and is further restricted by the characteristics of metals in use. Another proposal made in JP6-322126 A involves direct lamination of a polyimide resin of low thermal expansion to a metal foil to provide a material processible by wet etching with an aqueous alkaline solution; however, no interest at all is expressed here in the subject of adhesiveness and the material in question is restricted in use, for example, a laminate having metal foils on both sides cannot be made from the polyimide resin in question because of its characteristically high glass transition temperature (Tg). Still further, lamination is effected by directly applying a polyimide resin to a metal foil followed by drying according to the aforementioned process and, although a laminate of polyimide resin and metal foil shows good planarity, the polyimide layer by itself develops warpage. This leads to a problematical situation where warpage and undulation develop readily during etching of the metal foil. Therefore, there has been a strong demand for laminates composed of metal foils and polyimide resins that are processible by wet etching and exhibit high heat resistance and good adhesiveness to metal foils.

DISCLOSURE OF THE INVENTION

Accordingly, an object of this invention is to provide laminates based on polyimide resins which maintain good heat resistance and dimensional stability after heat treatment or the properties hitherto required but unattained and show good adhesiveness to metal foils. Another object of this invention is to provide laminates based on polyimide resins which are processible by wet etching with an aqueous alkaline solution and a process for manufacturing said laminates.

A laminate of this invention consists of a metal foil and an insulating resin layer composed of a plurality of polyimide resin layers and the insulating resin layer comprises at least one polyimide resin layer (A) of low thermal expansion with a coefficient of linear thermal expansion (CTE) of $30 \times 10^{-6}/°$C. or less and at least one polyimide resin layer (B) with a glass transition temperature (Tg) of 300° C. or below; the aforementioned polyimide resin layer (B) is in contact with the metal foil, the bonding strength between the polyimide resin layer (B) and the metal foil is 0.5 kN/m or more and the average rate of etching of the insulating resin layer by a 50 wt % aqueous solution of potassium hydroxide at 80° C. is 0.5 μm/min or more.

Further this invention relates to a method for manufacturing a laminate which comprises applying a solution of polyimide resin or precursor thereof to a metal foil followed by drying to form a polyimide resin layer (B), applying a solution of polyimide resin or precursor thereof to the polyimide resin layer (B) followed by drying to form a polyimide resin layer (A), further applying, if necessary, a solution of polyimide resin or precursor thereof to the polyimide resin layer (A) followed by drying to form a polyimide resin layer (B) and subjecting the arranged layers to a heat treatment at a temperature above 200° C.

Further, this invention relates to a method for manufacturing a laminate which comprises applying a solution of precursor resin or resin which is to form a polyimide resin layer with a Tg of 300° C. or below to both sides of a polyimide resin film with a CTE of $30 \times 10^{-6}/°$C. or less followed by drying to form a plurality of resin layers, subjecting the arranged layers to a heat treatment at a temperature above 200° C., putting one or two or more of the resultant laminated polyimide film between metal foils and subjecting to thermocompression bonding.

Still further, this invention relates to a method for processing a laminate which comprises etching the metal foil of the aforementioned laminate in a specified pattern, forming a resist layer of a specified pattern on the surface of the instating layer and etching the insulating layer in the shape of a specified pattern by a 5-80 wt % aqueous solution of alkali metal kept at a temperature above 50° C.

Finally, this invention relates to a method for forming a laminated film based on polyimide resins which comprises applying a solution of precursor resin or resin which is to form a polyimide resin layer with a Tg of 300° C. or below to both sides of a polyimide resin film with a CTE of $30 \times 10^{-6}/°$C. or less followed by drying to form a plurality of resin layers and subjecting the arranged layers to a heat treatment at a temperature above 200° C. to form a laminated film with an average rate of etching of 0.5 μm/min or more by a 50 wt % aqueous solution of potassium hydroxide at 80° C.

The laminate of this invention has a multilayer structure consisting of a metal foil and an insulating resin layer; the insulating resin layer comprises a polyimide resin layer (A) of low thermal expansion with a CTE of $30 \times 10^{-6}/°$C. or less and a polyimide layer (B) with a Tg of 300° C. or below and the polyimide resin layer (B) is in contact with the metal foil. Typical examples of this multilayer structure are the following but not limited thereto. In the examples, M stands for the metal foil, (B) for the polyimide resin layer (B), (A) for the polyimide resin layer (A) and (C) for other resin layer.

(1) M/(B)/(A), (2) M/(B)/(A)/(B), (3) M/(B)/(A)/(B)/M, (4) M/(B)/(A)/(A)/(B)/M, (5) M/(B)/(A)/(B)/(B)/(A)/(B)/M, and (6) M/(B)/(A)/(C)/(A)/(B)/M.

In case there are two layers or more of M, (B) or (A), they may be identical with or different from each other. In case another resin layer (C) is used, it is preferably a layer of polyimide resin from the standpoint of heat resistance and etching quality.

Of the aforementioned multilayer structures of the laminates, those represented by (1), (2), (3) and (5) are preferred.

The Tg of the polyimide resin layer (B) needs to be 300° C. or below and it is preferably 200-250° C. The CTE is preferably in excess of $30 \times 10^{-6}$/° C. from the standpoint of adhesiveness.

The CTE of the polyimide resin layer (A) needs to be $30 \times 10^{-6}$/° C. or less and it is preferably $25 \times 10^{-6}$/° C. or less.

Any polyimide resin layer satisfying both of the requirements, namely, a CTE of $30 \times 10^{-6}$/° C. or less and a Tg of 300° C. or below, is treated as polyimide resin layer (A).

The rate of etching of the insulating resin layer in the laminate of this invention, as evaluated by a 50 wt % aqueous solution of potassium hydroxide at 80° C., needs to be 0.5 µm/min or more and it is preferably 2.0 µm/min or more, more preferably 4.0-20.0 µm/min.

Moreover; the bonding strength between the polyimide resin layer (B) and the metal foil in contact therewith in the laminate of this invention is 0.5 kN/m or more, preferably 1.5 kN/m or more.

The Tg, CTE, rate of etching and bonding strength are evaluated according to the methods described in the examples.

The foils of metals used in the laminates of his invention include those of copper, aluminum, stainless steel, iron, silver, palladium, nickel, chromium, molybdenum, tungsten and alloys of these metals. Copper is cited as a material suitable for use in the substrates of flexible printed circuits. Copper and stainless steel are cited as materials suitable for use in load beams and flexures of HDD suspensions. The laminate of this invention is not limited to the end uses herein described and the metal foil is not limited to any specific kind of metal. In the cases where a laminate has metal foils on both sides or has two layers or more of metal foils, it is possible to vary the kind and thickness of metal foil from layer to layer.

Although there is no specific restriction on the thickness of a metal foil, the thickness of those metal foils which are used in flexible printed circuits and HDD suspensions is 3-300 µm, preferably 10-100 µm. It is allowable to apply a chemical or mechanical surface treatment to these conductors for the purpose of increasing the bonding strength still further.

The insulating resin layer constituting the laminate of this invention consists of a plurality of polyimide resin layers. The polyimide resin layer in contact with the metal foil needs to be the polyimide resin layer (B).

It is preferable that the polyimide resin layer (B) to be used in this invention has a Tg of 300° C. or below and can be etched at a specified rate by an aqueous alkaline solution. Polyimide resins of this kind can be prepared by the reaction of the following tetracarboxylic acids, preferably their acid anhydrides, with diamines.

A preferable tetracarboxylic acid dianhydride is one kind or more selected from pyromellitic dianhydride (PMDA), 3,4,3',4'-benzophenonetetracarboxylic acid dianhydride (BTDA), 3,4,3',4'-diphenylsulfonetetracarboxylic acid dianhydride (DSDA) and bis(anhydro-trimellitate)-based tetracarboxylic acid dianhydrides (TMEDA) represented by the following general formula (1)

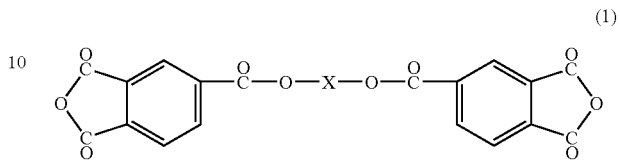

(wherein X is a straight-chain or branched divalent aliphatic hydrocarbon group containing 2-30 carbon atoms and optionally a substituent). Any of them is contained in an amount corresponding to 50 mol % or more, preferably 80 mol % or more, of the total tetracarboxylic acid dianhydrides.

Furthermore, PMDA is added in an amount corresponding to preferably 80 mol % or less, more preferably 10-60 mol %, of the total dianhydrides because it raises the Tg. BTDA, DSDA or TMEDA is used in an amount corresponding to 20-100 mol %, preferably 30-100 mol %, of the total tetracarboxylic acid dianhydrides.

The group X in TMEDA represented by formula (1) is a strait-chain or branched divalent aliphatic hydrocarbon group (including alkylidene group) containing 2-30 carbon atoms and optionally a substituent and the backbone chain and the side chains may be substituted by functional groups such as halogens and aromatic rings. The Tg tends to drop as the number of carbon atoms in the group X in formula (1) increases. This tendency can be beneficial when TMEDA is used together with PMDA which raises the glass transition temperature. However, an excessively large increase in the number of carbon atoms in X deteriorates the heat resistance. In consequence, the number of carbon atoms in X is preferably 2-25, more preferably 2-10.

BTDA, DSDA and TMEDA may be used alone, but their use together with PMDA produces a good etching quality and a preferable proportion is 5-80 mol % of PMDA and 20-95 mol % of these tetracarboxylic acid dianhydrides or a more preferable proportion is 30-60 mol % of the former and 40-70 mol % of the latter. In addition, 3,3',4,4'-biphenyltetracarboxylic add dianhydride (BPDA) and 4,4'-oxydiphthalic add dianhydride (ODPDA) are useful as tetracarboxylic acid dianhydrides; however, they deteriorate markedly the wet etching quality by an aqueous alkaline solution and they are preferably added in an amount corresponding to 30 mol % or less, more preferably 10 mol % or less, of the total tetracarboxylic acid dianhydrides.

The diamines to be submitted to the reaction with the aforementioned tetracarboxylic acid anhydrides are preferably one kind or more of diamines selected from p-phenylenediamine (p-DAP), m-phenylenediamine (m-DAP), 2,4-diaminotoluene (DAT), 1,3-bis(3-aminophenoxy)benzene (APB), 4,4'-diamino-2'-methoxybenzanilide (MABA), 3,4'-diaminodiphenyl ether (DAPE34) and bis(aminophenoxy) compounds (BAP) represented by the following general formula (2)

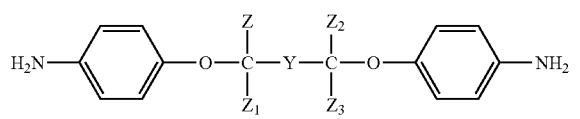

(2)

(wherein $Z-Z_3$ are independently hydrogen atoms and alkyl groups containing 1-3 carbon atoms and Y is a straight-chain or branched divalent aliphatic hydrocarbon group containing 1-5 carbon atoms and optionally a substituent).

These diamines account for 50 mol % or more, preferably 80 mol % or more, of the total diamines.

The groups $Z-Z_3$ in BAP represented by formula (2) are independently hydrogen atoms and alkyl groups containing 1-3 carbon atoms and they are identical with or different from one another. The group Y is a straight-chain or branched alkylene group (including an alkylidene group) containing 1-5 carbon atoms. Moreover, Y and $Z-Z_3$ may have a substituent such as halogen and aromatic hydrocarbon group.

In the cases where a selection of diamines is made from the four kinds of diamines or p-DAP, m-DAP, MABA and DAT among the aforementioned seven kinds of diamines, an increased addition of any of these four diamines leads to a higher Tg and compression bonding becomes impossible to perform or requires a too high temperature. Therefore, these four diamines are added in an amount corresponding to 80 mol % or less, preferably 10-60 mol %, of the total diamines. Furthermore, in the cases where one kind or more of diamines selected from the aforementioned four diamines are used together with PMDA, the amount used of these four kinds of diamines is 60 mol % or less, preferably 20-50 mol %. There is no restriction such as this in selecting one kind or more of diamines from APB, DAPE34 and BAP.

Diamines other than the aforementioned seven kinds may be used and, as noted above, they are preferably used in an amount corresponding to 50 mol % or less of the total diamines. Such other diamines include 4,4'-diamino-2,2'-dimethylbiphenyl (DADMB), 4,4'-diaminodiphenyl ether (DAPE44), 2,2'-bis[4-(4-aminophenoxy)phenyl]propane (BAPP), 4,4'-bis(3-aminophenoxy)biphenyl (BABP), 4,4'-diaminodiphenylpropane, 3,3'-diaminobenzophenone and 4,4'-diaminodiphenyl sulfide. Of these, BAPP and BABP are preferred. Addition of these diamines is restricted because addition of a small amount markedly deteriorates the etching quality by an aqueous alkaline solution.

Polyimide resins constituting the polyamide resin layer (B) can be prepared by known methods. For example, staining from a tetracarboxylic acid and a diamine in roughly equimolar amounts, the object polyimide resin is prepared in two steps, namely, synthesis of polyamic acid or the precursor of polyimide in solution and the subsequent imidation of the polyamic acid. Examples of such tetracarboxylic acid are tetracarboxylic adds, their acid anhydrides, esters and add halides and tetracarboxylic add dianhydrides are desirable as they facilitate the preparation of polyamic adds. Those tetracarboxylic acid dianhydride and diamines which are considered preferable above account for 50 mol % or more, preferably 70 mol %, of the tetracarboxylic add dianhydrides and diamines as a whole which is taken as 100 mol %. Furthermore, the remaining structural unit is preferably the one generated by a tetracarboxylic add dianhydride and a diamine.

The polyimide resins as used in this invention refer to polymers containing the imide group in their structure such as polyimide, polyamideimide, polyetherimide, polysiloxaneimide and polybenzimidazoleimide and include polyimide resins constituting the polyimide resin layers (A) and (B).

As for the polyimide resin constituting the polyimide resin layer (A) of low thermal expansion with a CTE of $30 \times 10^{-6}/°$ C. or less in this invention, any of known polyimide resins of low thermal expansion may be used as such. The resin in question is prepared by the reaction of a tetracarboxylic acid, preferably its add dianhydride, with a diamine.

There is no restriction on tetracarboxylic acid dianhydrides to be used in the synthesis of the aforementioned polyimide resins, although PMDA being suitable. It is possible to obtain good quality for etching by an aqueous alkaline solution and property of low thermal expansion in case PMDA accounts preferably for 60 mol % or more, more preferably for 80 mol % or more, of the total tetracarboxylic acid dianhydrides. Other tetracarboxylic acid dianhydrides include BTDA DSDA TMEDA, BPDA and ODPDA BPDA and ODPDA are effective for producing resins of low moisture absorption, but markedly deteriorate the etching quality by an aqueous alkaline solution. Therefore, BPDA or ODPDA is added at a rate of 40 mol % or less, preferably 20 mol % or less, of the total tetracarboxylic acid dianhydrides. Moreover, from the standpoint of producing resins of low thermal expansion, BTDA DSDA or TMEDA is added preferably at a rate of 50 mol % or less, more preferably at a rate of 30 mol % or less, of the total tetracarboxylic acid dianhydrides.

Suitable diamines include P-DAP, m-DAP, DAT, APB, DAPE34 and MABA and p-DAP and MABA are particularly effective for producing resins which manifest low thermal expansion. DADMB and DAPE44 are also effective as they produce resins of low thermal expansion without seriously deteriorating the etching quality by an aqueous alkaline solution. Other diamines such as BAPP, BABP, 4,4'-diaminodiphenylpropane, 3,3'-diaminobenzophenone and 4,4'-diaminodiphenyl sulfide may be used in combination, but the addition of BAPP and BABP is restricted as they markedly deteriorate the etching quality by an aqueous alkaline solution when added even in a small amount.

A general procedure for the synthesis of the aforementioned polyimide resins is to allow a mixture of roughly equimolar quantities of a tetracarboxylic acid dianhydride and a diamine to react in a solvent such as N-methyl-2-pyrrolidone (NMP), methylformamide, N,N-dimethylacetamide (DMAc), dimethyl sulfoxide, dimethyl sulfate, sulfolane, butyrolactone, cresol, phenol, halogenated phenol, cyclohexane, dioxane, tetrahydrofuran, diglyme and triglyme at a temperature in the range of 0-200° C., preferably in the range of 0-200° C., thereby yielding a solution of the precursor of polyimide resin. The precursor is then subjected to a heat treatment at a high temperature above 200° C. to effect imidization to polyimide.

There is no restriction on the method for forming the insulating resin layer in the laminate of this invention and an advantageous procedure is to apply a solution of polyimide precursor to a substrate such as a metal foil or polyimide film of low thermal expansion exhibiting a CTE of $30 \times 10^{-6}/°$ C. or less, dry the solution and subject the coated metal foil or polyimide film to a heat treatment to effect imidation or to imidize a precursor solution, apply the resulting polyimide solution to a substrate, dry and subject to a heat treatment. In the case of a polyimide precursor solution, the imidation reaction is effected by applying the precursor solution to a substrate to form a film, drying the film and subjecting the dried film to a heat treatment at 200° C. or above, preferably at 300° C. or above.

The insulating resin layer containing a plurality of resin layers can be prepared by the following methods (1) to (5).
(1) To repeat a procedure of applying a resin solution to a metal foil followed by drying.
(2) To apply two kinds or more of polyimide resin solutions or polyimide precursor solutions simultaneously to a metal foil by the use of a multilayer die followed by drying.
(3) To form a plurality of resin layers on a metal foil and bond two of the resulting laminates by thermocompression with the polyimide resin layers facing each other.
(4) To form polyimide resin layers (B) on both sides of a polyimide resin film, put one or more of the resulting laminated polyimide resin films between metal foils and bond them by thermocompression.
(5) To form a polyimide resin layer (B) on a metal foil and bond to a laminated polyimide film by thermocompression.

Of the methods (1)-(5) described above, a process suitable for the manufacture of the laminate of this invention is the method (1) that consists of applying a solution of resin to a metal foil drying the solution, repeating the procedure to form a plurality of polyimide resin layers, and subjecting the arranged layers to a heat treatment to give a laminate containing a plurality of polyimide resin layers. In this case, the resin layer in contact with the metal foil must be the polyimide resin layer (B).

A number of methods are available for curing and a method in general practice is to perform a heat treatment at a high temperature (200° C. or above) by placing a preliminarily dried laminate containing a solution of uncured polyimide precursor in a hot-air drying oven which can be set at a specified temperature and holding it stationary there for a given length of time or by moving the laminate continuously inside the drying oven to secure a specified time for drying and curing.

In the step for drying and curing, the polyimide resin solution or polyimide precursor resin solution is applied uniformly to the metal foil, stripped of the solvent by a heat treatment and, in the case of the polyimide precursor, subjected to ring closing imidation. If the heat treatment is performed rapidly at a high temperature during his step, a skin layer forms on the resin surface and this causes the solvent to evaporate with difficulty or undergo foaming. Therefore, it is desirable to perform the heat treatment by gradually raising the temperature.

The imidation reaction is normally carried out by applying a solution of polyamic acid resin to a substrate such as metal foil and polyimide resin film, evaporating the solvent and then performing a heat treatment at a high temperature. In case the polyimide resin after imidation shows good solubility in a solvent, it is possible to carry out the imidation of polyamic acid resin in solution under heat and applying the resultant polyimide resin solution to a substrate. It is further possible here to add an amine such as polyimide and quinoline or acetic anhydride to accelerate the imidation reaction. Still further, it is possible to add a filler, a silane coupling agent or other additives to the polyimide resin as needed.

The thickness of all the polyimide resin layers constituting the insulating resin layer is preferably 3-100 µm, more preferably 4-75 µm, most preferably 5-75 µm. The thickness of the polyimide resin layer (B) to be formed on a metal foil or a polyimide resin film of low thermal expansion with a CTE of $30 \times 10^{-6}$/° C. or less is preferably in the range of 0.5-7 µm, more preferably in the range of 0.5-5 µm, from the standpoint of obtaining low thermal expansion. The ratio in thickness of polyimide resin layer (A)/polyimide resin layer (B) in the total polyimide resin layers is in the range of 2-100, preferably in the range of 5-50.

In the cases where the polyimide resin layer (A) is formed on a metal foil with the polyimide resin layer (B) intervening between the two, the thickness of the polyimide resin layer (A) is preferably 3-75 µm, more preferably 3-50 µm, from the standpoint of drying efficiency of a solution of polyimide precursor resin or polyimide resin in the manufacturing step.

However, there is no restriction on the film thickness in the cases where the polyimide resin layer (B) is formed on a metal foil and then laminated to a polyimide resin film of low thermal expansion by thermocompression bonding. Moreover, in the cases where the polyimide resin layer (B) is formed on a polyimide resin film of low thermal expansion, the thickness of the polyimide resin layer (B) is preferably in the range of 0.5-7 µm, more preferably in the range of 0.5-5 µm, and there is no restriction on the thickness of the polyimide resin film of low thermal expansion.

In order to control warpage and the like in the laminate of this invention, it is desirable that the difference in thermal expansion between the metal foil and the insulating resin layer is small and the CTE of the insulating resin layer as a whole is preferably $30 \times 10^{-6}$/° C. or less.

In order to prevent an occurrence of undulation and warpage after etching in the secondary processing of the laminate, the insulating resin layer itself is required to warp little and be flat. A method suitable for obtaining planarity for the insulating resin layer composed of the aforementioned polyimide resin layers is to adopt a construction in which the polyimide resin layer (B) is arranged on both sides of the polyimide resin layer (A) because the polyimide resin layer (B) in contact with the metal foil shows relatively high thermal expansion; further, a method of balancing warpage by controlling the thickness of each constituent layer of the laminate is preferable for its simplicity and the insulating resin layer contains preferably three or more of polyimide resin layers. The polyimide resin layer (A) and the polyimide resin layer (B) are both indispensable because the former is important for enhancing the planarity of the insulating resin layer and the latter in contact with the metal foil is important for increasing the adhesiveness. However, since the polyimide resin layer (B), if thicker than is necessary, deteriorates planarity and decreases the rate of etching, the polyimide resin layer (A) is preferably made relatively thick As for the etching quality of the insulating resin layer in the laminate of tis invention by an aqueous alkaline solution, the rate of etching by a 50% aqueous solution of potassium hydroxide at 80° C. needs to be 0.5 µm/min or more. Higher the rate of etching, the better becomes the etching shape.

The rate of etching of the polyimide resin layer (A) is 2 µm/min or more, preferably 6 µm/min or more, more preferably 10-50 µm/min. The rate of etching of the polyimide resin layer (B) is 0.3 µm/min or more, preferably 0.51 µm/min or more, more preferably 0.6-3 µm/min.

In the cases where the polyimide resin layer has a multilayer structure, it is preferable to vary the ratio of rate of etching of each layer in order to obtain good etching shape and the rate of etching of the polyimide resin layer (A) positioned in the middle is preferably 1.0-30 times, preferably 2.0-20 times, that of the polyimide resin layer (B) in contact with the metal foil. Moreover, it is allowable to select a single resin layer or a plurality of resin layers differing in the rate of etching from one another respectively for the polyimide resin layers (A) and (B) and it is preferable to select a polyimide resin having an optimal rate of etching which matches to the laminating position in compliance with etching shape.

The average rate of etching of the insulating resin layer needs to be 0.5 µm/min or more as determined by the aforementioned method. However, it is naturally possible to carry out etching under the conditions different from those in the aforementioned method for determination and the rate of etching in such a case exceeds or falls short of 0.5 µm/min depending upon the kind and concentration of the aqueous alkaline solution in use. For example, there may be a case where even a rate of etching of 0.1 µm/min or more in the portion contacting the metal farthest from the etching surface may yield a good etching shape in wet etching to be effected by an aqueous alkaline solution from one side and the rate of etching may be off the aforementioned rate of 0.5 µm/min or more depending upon the end use. However, it is advantageous to perform etching at a rate of 0.5 µm/min or more and, in case etching is performed by substituting the aqueous alkaline solution in the current use for another, etching can be controlled by changing the conditions such as temperature.

When etching is performed to process the laminate of this invention, the etching solution is an aqueous alkaline solution, preferably an aqueous solution of alkali metal or a mixture containing alkali metal. Etching progresses most effectively when potassium hydroxide is used as alkali. In addition, sodium hydroxide and lithium hydroxide and alkaline earth metal hydroxides can be used, but potassium and sodium or a mixture thereof is preferred from the standpoint of etching quality.

Furthermore, in order to enhance its affinity for polyimide, the aqueous solution of alkali metal may advantageously contain an organic solvent such as the following; a hydroxyalkylamine such as primary amine-derived ethanolamine, propanolamine and butanolamine and secondary amine-derived diethanolamine and dipropanolamine, hydrazine monohydrate, ethylenediamine, dimethylamine, dimethylformamide, cresol and ethylene glycol. Any solvent other than the aforementioned may be used if it shows a high affinity for polyimide.

As for the concentration of aqueous alkaline solution in the case of alkali metal hydroxide, the alkali metal hydroxide preferably accounts for 5-80 wt % of the sum total of water and alkali metal hydroxide. A concentration of less than 5 wt % lowers the rate of etching and the object etching shape becomes difficult to obtain while a concentration of more than 80 wt % is undesirable from the manufacturing point of view as a solid matter forms and the viscosity increases at the time of cooling and the like. A suitable concentration to obtain a good etching shape is 30-70 wt %. The higher the temperature, the higher becomes the rate of etching and the range of temperature for etching is preferably 50° C. or above, more preferably 60-90° C. However, the temperature is not limited to the aforementioned range because it is possible to change the etching quality by using an additive capable of enhancing the affinity for polyimide or by changing the concentration of alkali. In the cases where an organic solvent such as the aforementioned is added, the amount added is preferably 0.5-2.0 times the sum total of water and alkali metal hydroxide.

The laminates of this invention are available in such forms as a single-sided laminate having a metal foil on one side, a double-sided laminate having metal foils on both sides and the like and it is advantageous to prepare a double-sided laminate having metal foils on both sides of the resin insulating layer. An advantageous method for preparing a double-sided laminate consists of placing a metal foil on the outermost polyimide resin layer (B) of a laminate having a structure of metal foil/polyimide resin layer (B)/polyimide resin layer (A)/polyimide resin layer (B) and bonding the two by thermocompression. Another desirable method consists of arranging two laminates respectively having a structure of metal foil/polyimide resin layer (B)/polyimide resin layer (A)/polyimide resin layer (B) with the two outermost polyimide resin layers (B) facing each other and bonding the two laminates by thermocompression. Still another desirable method consists of arranging two laminates respectively having a structure of metal foil/polyimide resin layer (B)/polyimide resin layer (A) with the two polyimide resin layers (A) facing each other and bonding the two laminates by thermocompression.

For example, a solution of polyimide resin or precursor thereof is applied to a metal foil, dried and cued, and further bonded by thermocompression to a metal foil to give a double-sided laminate. In another way, a solution of polyimide resin with a Tg of 300° C. or below or a solution of the precursor of such polyimide resin is applied to a metal foil, dried and cured, and two of such resin-coated metal foils are bonded by thermocompression to both sides of a polyimide resin film of low thermal expansion to give a double-sided laminate. In still another way, a solution of polyimide resin with a Tg of 300° C. or below or a solution of the precursor of such polyimide resin is applied to both sides of a polyimide resin film of low thermal expansion, dried and cured and the resultant laminated polyimide resin film is bonded to metal foils by thermocompression to give a double-sided laminate. Furthermore, a pair of laminates having a structure of metal foil/polyimide resin layer (B)/polyimide resin layer (A)/polyimide resin layer (B) or a structure of metal foil/polyimide resin layer (B)/polyimide resin layer (A) are prepared in advance according to the aforementioned method and pressed together with the resin sides facing each other to give a double-sided laminate. It is preferable to use a pair of the former laminates from the standpoint of bonding strength between the resin layers and a combination of the former and the latter also satisfies the requirement for adhesiveness.

The aforementioned thermal pressing can be carried out by the use of an ordinary hydropress, a vacuum hydropress, an autoclaving vacuum press, a continuous thermal laminator and the like. A vacuum hydropress is desirable because of availability of sufficient pressure for pressing, easy removal of residual volatile matters and prevention of the oxidation of metal foils. The temperature of a thermal press during the aforementioned thermocompression bonding is not restricted in any specific way, but it is preferably a temperature above the glass transition temperature of polyimide resins in use, more preferably a temperature higher than the Tg by 5-150° C. The pressure of a thermal press is suitably 1-50 MPa although it depends on the kind of press in use.

When thermal pressing is performed by the use of a hydropress, it is possible to obtain a multilayer laminate in one thermal pressing operation by fabricating sheets of the aforementioned single-sided laminates and metal foils, placing one sheet upon another several times and pressing together in a thermal press under heat and pressure.

The laminate of this invention is further processed preferably by etching the metal foil in a specified pattern, forming a resist layer of a specified pattern on the surface including the position of the insulating resin layer which should not be processed by etching, and etching the insulating resin layer at 50° C. or above by an aqueous alkaline solution or a mixture thereof in a specified pattern.

PREFERRED EMBODIMENTS OF THE INVENTION

Various properties in the examples are evaluated by the methods described below. The polyimide resins used in the test specimens are fully imidized.

Determination of Glass Transition Temperature (Tg)

The specimen, 10 mm in width, was heated from room temperature to 400° C. at a rate of 10° C./min while receiving a vibration of 1 Hz in a viscoelasticity analyzer (RSA-II, available from Rheometric Science FE Ltd.) and the glass transition temperature was obtained from the maximum of loss tangent (tan δ).

Determination of Coefficient of Linear Thermal Expansion (CTE)

The specimen was heated to 250° C., maintained at this temperature for 10 minutes and then cooled at a rate of 5° C./min in a thermomechanical analyzer (available from Seiko Instruments Inc.) and the CTE was obtained as an average from 240° C. to 100° C.

Determination of Rate of Etching

A polyimide resin layer was formed on the surface of a stainless steel (SUS) foil, the thickness of the resin layer was measured, then the resin layer with the SUS foil attached thereto was immersed in a 50% aqueous solution of potassium hydroxide at 80° C. until the resin disappeared completely, the time for disappearance of the resin was measured and the rate of etching was determined by dividing the initial thickness of the resin layer by the time required for etching. For those polyimide resins which required a long time for etching, the loss in thickness of the resin layer by etching was divided by the time required for that much etching to obtain the rate of etching.

Evaluation of Processibility by Etching

The processibility of polyimide resins by etching with an aqueous alkaline solution was evaluated by immersing the laminate specimen in a plastic container filled with a 50% aqueous solution of potassium hydroxide to which ethylenediamine and ethylene glycol had been added, respectively in an amount corresponding to 20 wt %, to enhance the affinity for polyimide and heating in a water bath at 80° C. until the polyimide was removed completely.

Determination of Bonding Strength

The specimen for determining the bonding strength between metal foil and polyimide resin layer was prepared by applying a polyimide resin to a copper foil, bonding another copper foil by thermocompression to give a double-sided laminate, which was punched into a shape measuring 10 mm×160 mm. One specimen was pasted to a clamp plate with the copper foil coated by the resin facing the plate while another specimen was pasted to the clamp plate with the copper foil bonded by thermocompression facing the plate, and the metal foil in each specimen was peeled off in the 180° direction in a tensile tester (Strograph-M1, available from Toyo Seiki Co., Ltd.) to determine the bonding strength.

The following symbols were used in the examples and elsewhere.

PMDA: pyromellitic dianhydride
BTDA: 3,4,3',4'-benzophenonetetracarboxylic acid dianhydride
DSDA: 3,4,3',4'-diphenylsulfonetetracarboxylic acid dianhydride
BPDA: 3,3',4,4'-biphenyltetracarboxylic acid dianhydride
TMEG: ethylene glycol bis(anhydro-trimellitate)
MABA: 4,4'-diamino-2'-methoxybenzanilide
DAPE34: 3,4'-diaminodiphenyl ether
DAPE44: 4,4'-diaminodiphenyl ether
APB: 1,3-bis(3-aminophenoxy)benzene
TPE-R: 1,3-bis(4-aminophenoxy)benzene
TPE-Q: 1,4-bis(4-aminophenoxy)benzene
DANPG: 1,3-bis(4-aminophenoxy)-2,2-dimethylpropane
p-DAP: p-phenylenediamine
m-DAP: m-phenylenediamine
DADMB: 4,4'-diamino-2-2'-dimethylbiphenyl
BAPP: 2,2'-bis[4-(4-aminophenoxy)phenyl]propane

SYNTHETIC EXAMPLE 1

Synthesis of Polyimide for Polyimide Resin Layer (A)

The diamines specified in each column in Table 1 were weighed and dissolved in 340 g of DMAc with stirring in a 500-ml separable flask. The resulting solution was cooled in an ice bath and the tetracarboxylic acid dianhydride specified likewise in Table 1 was added to the solution while passing a stream of nitrogen in the flask. The solution was returned to room temperature and allowed to polymerize with stirring for 3 hours to give a viscous solution of polyimide precursor A, B, C or D.

Each of the polyimide precursor solutions A-D was applied to a stainless steel foil (SUS 304, tension-annealed, a product of Nippon Steel Corporation) by the use of an applicator to a thickness after curing of 13 μm, dried at 110° C. for 5 minutes, and then subjected to a stepwise heat treatment for 3 minutes each at 130, 160, 200, 250, 300 and 360° C. to form a polyimide layer on the stainless steel foil. Thereafter, the specimen with the stainless steel foil still attached was tested for the rate of etching by immersing it in a 50% aqueous solution of potassium hydroxide at 80° C. Another specimen of the same structure was treated with an aqueous solution of ferric chloride to remove the stainless steel foil and the remaining polyimide film was separated and determined for its CTE.

|  | A | B | C | D |
|---|---|---|---|---|
| Amount added (g) | | | | |
| MABA | 20.6 | — | 18.8 | 20.4 |
| p-DAP | — | 10.8 | — | — |
| DAPE44 | 10.7 | 13.4 | 4.9 | — |
| BAPP | — | — | 10.0 | — |
| DADMB | — | — | — | 11.2 |
| PMDA | 28.8 | 35.8 | 26.2 | 28.4 |
| Rate of etching (μm/min) | 13.7 | 34.0 | 0.2 | 8.1 |
| CTE (ppm/°C.) | 17.7 | 16.7 | 22.5 | 15.5 |

SYNTHETIC EXAMPLE 2

Synthesis of Polyimide for Polyimide Resin Layer (B)

The diamines specified in each column in Tables 2 and 3 were weighed and dissolved in 340 g of DMAc with stirring in a 500-ml separable flask. Then, the tetracarboxylic acid dianhydrides specified likewise in these tables were added to the solution while passing a stream of nitrogen in the flask.

Thereafter, the solution was allowed to polymerize with stirring for 3 hours to give a viscous solution of each of the polyimide precursors H-S.

Each of these polyimide precursor solutions H-S was applied to the aforementioned stainless steel foil, dried at 120° C. for 5 minutes and at 110° C. for 5 minutes and then subjected to a heat treatment in the same manner as above to form a polyimide layer on the stainless steel foil. The rate of etching and Tg of the polyimide layer were determined and the results are shown in Tables 2 and 3. The solution M is shown for comparison as the polyimide prepared therefrom shows a Tg exceeding 300° C.

TABLE 2

|  | H | I | J | K | L | M | N | O |
|---|---|---|---|---|---|---|---|---|
| Amount added (g) | | | | | | | | |
| APB | 30.5 | | | | | | 23.8 | |
| DANPG | | 30.2 | | | | | | 22.1 |
| DAPE34 | | | 24.8 | | | | | 6.6 |
| TPE-R | | | | 30.5 | | | | |
| BAPP | | | | | 35.5 | | | |
| p-DAP | | | | | | 16.6 | 3.7 | |
| PMDA | 9.2 | 9.3 | 10.9 | 92 | 7.6 | 13.5 | 10.2 | 9.7 |
| BIDA | 20.3 | 20.6 | 24.2 | 20.3 | 16.9 | 29.9 | 22.5 | 21.5 |
| Pressing temperature (° C.) | 310 | 310 | 360 | 360 | 340 | — | 320 | 320 |
| Rate of etching (μm/min) | 0.7 | 0.7 | 0.8 | 0.3 | <0.1 | 8.1 | 1.1 | 2.1 |
| $T_g$ (° C.) | 214 | 212 | 286 | 278 | 280 | >400 | 223 | 235 |

TABLE 3

|  | P | Q | R | S |
|---|---|---|---|---|
| Amount added (g) | | | | |
| APB | 21.8 | 21.4 | 22.6 | 24.4 |
| p-DAP | 3.5 | 3.4 | 3.6 | 3.9 |
| BTDA | 34.7 | | | |
| PMDA | | 9.2 | 9.7 | 10.5 |
| TMEG | | 26.0 | | |
| DSDA | | | 24.1 | |
| BPDA | | | | 21.2 |
| Pressing temperature (° C.) | 310 | 300 | 320 | 320 |
| Rate of etching (μm/min) | 0.1 | 1.2 | 1.6 | 0.1 |
| Tg (° C.) | 205 | 203 | 216 | 228 |

EXAMPLE 1

Each of the polyimide precursor solutions H, I, J, N, O, Q and R prepared in Synthetic Example 2 was applied by the use of a bar coater to an 18 μm-thick rolled copper foil (C7025, available from Olin Sommers) to a thickness after curing of 1 μm and dried at 110° C. for 3 minutes to form a first layer on the copper foil, a solution of the polyimide precursor A prepared in Synthetic Example 1 was applied to the first layer to a thickness after curing of 14 μm and dried at 110° C. for 10 minutes to form a second layer. Thus, seven kinds of preliminary laminates having first and second layers were prepared. Then, the same polyimide precursor solution as used above in forming the first layer was applied to the second layer of each of the seven kinds of preliminary laminates to a thickness after curing of 1 μm, dried at 110° C. for 3 minutes to form a third layer and subjected to a stepwise heat treatment for 3 minutes each at 130, 160, 200, 250, 300 and 360° C. to complete imidation. In this manner, seven kinds of single-sided laminates having a copper foil and a 16 μm-thick multilayer of polyimide resins were prepared Thereafter, a rolled copper foil (C7025, TM-03, thickness 18 μm) was placed on top of the third polyimide resin layer and bonded by thermocompression in a vacuum press for 20 minutes at 15 MPa and at the temperature shown in Tables 2 and 3. Thus, seven kinds of double-sided copper-polyimide laminates were prepared.

The copper foil of the laminate thus prepared was processed to form a specified pattern by the use of a ferric chloride solution and then immersed in a 50% aqueous solution of potassium hydroxide at 80° C. for the length of time specified in Table 4 while using the copper foil remaining on the insulating polyimide resin layer as a substitute for a protective film of a resist and the like. Following this, the remaining copper foil was etched off by ferric chloride and the polyimide layer thereby exposed was observed. Formation of a good etching shape was confirmed in each case. The bonding strength between copper foil and polyimide and the CTE of the polyimide film (insulating resin layer) obtained after removal of the copper foil by etching are shown in Table 4.

TABLE 4

| Polyimide precursors in the first and third layers | H | I | J | N | O | Q | R |
|---|---|---|---|---|---|---|---|
| Etching time (sec) | 215 | 195 | 180 | 175 | 160 | 180 | 155 |
| Bonding strength between copper foil and polyimide (coated surface) kN/m | 2.2 | 1.8 | 2.0 | 2.0 | 2.1 | 1.9 | 2.5 |
| Bonding strength between copper foil and polyimide (compression-bonded surface) kN/m | 2.1 | 1.6 | 2.0 | 2.1 | 2.3 | 1.7 | 2.4 |
| CTE ppm/° C. | 242 | 25.1 | 23.8 | 23.3 | 24.5 | 20.3 | 24.9 |

EXAMPLE 2

A double-sided laminate was prepared as in Example 1 except using the polyimide precursor solution R for the first and third layers and the polyimide precursor solution B or D for the second layer. The etching quality of the laminates was good. The bonding strength between copper foil and polyimide resin and the CTE of the polyimide film obtained by etching off the copper foil are shown in Table 5.

In Examples 1 and 2, the laminates whose metal foil was etched in a specified shape showed practically no warpage, the laminates after fabrication of the laminates and metal foils in a specified shape showed practically no warpage and the laminates showed no abnormalities such as blistering and peeling when tested for heat resistance in an oven at 30° C. for 1 hour.

TABLE 5

| Polyimide precursors in the first and third layers | R | R |
|---|---|---|
| Polyimide precursor of the second layer | B | D |
| Bonding strength between copper foil and polyimide (coated surface) kN/m | 2.1 | 2.5 |

TABLE 5-continued

| | | |
|---|---|---|
| Bonding strength between copper foil and polyimide (compression-bonded surface) kN/m | 2.3 | 2.7 |
| CTE ppm/° C. | 22.9 | 22.1 |

EXAMPLE 3

The polyimide precursor R prepared in Synthetic Example 2 was applied by the use of an applicator to a copper foil of the same kind as used in Example 1 to a thickness after curing of 1 µm, dried at 110° C. for 3 minutes and then subjected to a stepwise heat treatment for 3 minutes each at 130, 160, 200, 250, 300 and 360° C. to complete imidation to give a preliminary laminate having a 1 µm-thick polyimide resin layer (B) on a copper foil.

A polyimide resin film (Apical-NPI; thickness, 13 µm; CTE, 17 ppm/° C.) was inserted between two of such preliminary laminates with the polyimide side facing the film and bonded by thermocompression in a vacuum press at 15 MPa and 320° C. for 20 minutes to give a double-sided laminate having copper foils on both sides.

EXAMPLE 4

The polyimide precursor R prepared in Synthetic Example 2 was applied to a polyimide resin film (Apical-NPI, 13 µm to a thickness after curing of 1 µm, added at 110° C. for 3 minutes, then the polyimide precursor R was applied to the surface opposite to the polyimide resin film to a thickness after curing of 1 µm, and dried at 110° C. for 3 minutes to give a polyimide film having layers of the polyimide precursor R on both sides. This film was then subjected to a stepwise heat treatment for 3 minutes each at 130, 160, 200, 250, 300 and 360° C. to complete imidation. This procedure gave a laminated polyimide film with a thickness of 15 µm. The laminated film was placed between rolled copper foils (C7025, TM-03, thickness 18 µm and bonded by thermocompression in a vacuum press at 15 MPa and 320° C. for 20 minutes to give a double-sided laminate.

EXAMPLE 5

The polyimide precursor R prepared in Synthetic Example 2 and the polyimide precursor A prepared in Synthetic Example 1 were selected and they were processed as in Example 1 to give a copper-polyimide laminate (copper/R/A/R). Two of the laminates were placed one upon the other with the outermost polyimide layers facing each other and bonded by thermocompression in a vacuum press at 15 MPa and 320° C. for 20 minutes to give a double-sided laminate.

EXAMPLE 6

The polyimide precursor R prepared in Synthetic Example 2 and the polyimide precursor A prepared in Synthetic Example 1 were selected and they were processed as in Example 1, except substituting the rolled copper foil for an electrolytic copper foil (3EC3, available from Mitsui Mining and Smelting Co., Ltd), to give a double-sided laminate.

EXAMPLE 7

The polyimide precursor R prepared in Synthetic Example 2 and the polyimide precursor A prepared in Synthetic Example 1 were selected and they were processed as in Example 1, except substituting the lolled copper foil for a stainless steel foil, to give a double-sided laminate.

The evaluation of the laminates prepared in Examples 3-8 gave the following results.

In any of Examples 3-8, etching of polyimide by a 50% aqueous solution of potassium hydroxide at 80° C. gave a good etching shape, the laminates whose metal foil was etched in an arbitrary shape showed practically no warpage, the laminates after fabrication of the laminates and metal foils in a specified shape showed practically no warpage, and the laminates showed no abnormalities such as blistering and peeling when tested for heat resistance in an oven at 300° C. for 1 hour. The bonding strength on the stainless steel side (St) and on the copper foil side (Cu) and the CTE of a polyimide film obtained by etching off the metal foil are shown in Table 6.

TABLE 6

| Example | Bonding strength kN/m | | CTE $10^{-5}$/° C. |
|---|---|---|---|
| 3 | (Cu) 1.4 | (Cu) 1.3 | 2.4 |
| 4 | (Cu) 2.4 | (Cu) 2.5 | 2.4 |
| 5 | (Cu) 2.7 | (Cu) 2.7 | 2.4 |
| 6 | (Cu) 2.0 | (Cu) 1.9 | 2.4 |
| 7 | (Cu) 2.4 | (St) 1.9 | 2.4 |

EXAMPLE 8

The polyimide precursor R prepared in Synthetic Example 2 and the polyimide precursor A prepared in Synthetic Example 1 were selected and they were processed as in Example 1 to give a double-sided laminate. The copper layers on both sides of the laminate were processed in a specified shape by the use of ferric chloride and a lactic add-developing type resist (SFPOOGI-25AR, available from Nippon Steel Chemical Co., Ltd.) was laminated to the whole surface of the processed laminate in a laminator (ST Laminator 8B-5501D, available from Taisei Laminator Co., Ltd.) at a roll temperature of 60° C. The resist was exposed by the use of a specified negative pattern of 10 µm line and gap to a discharge lamp exposure apparatus (3000NEL, available from Hitech Co., Ltd.) at an integrated amount of light of approximately 100 mJ/cm$^2$ and the protective polyester film was peeled off The exposed resist was subjected to patterning by developing it in a horizontal conveyor type shower by the use of a 0.1% aqueous solution of lactic add at a liquid temperature of 25° C. and a shower pressure of 20 MPa for 8 seconds. The patterned resist was washed with pure water of 20° C., dried at 110° C. for 3 minutes, immersed in a bath containing a 50% aqueous solution of potassium hydroxide at 80° C. for 3 minutes and then washed with warm water of 40° C. The polyimide resin layer exposed from the processed protective resist layer was found to be etched completely. The remaining resist layer was removed in a horizontal conveyor type shower at a liquid temperature of 30° C. and a shower pressure of 20 MPa for 30 seconds. The polyimide layer of the laminate thus obtained showed a good sectional shape and 100 µm-wide lines were well formed with an accuracy within ±5 µm.

COMPARATIVE EXAMPLE 1

A double-sided laminate was prepared as in Example 1 except using the polyimide precursor K prepared in Synthetic Example 2 and the polyimide precursor A prepared in Synthetic Example 1.

The metal foils of the laminate were processed in an arbitrary shape by the use of ferric chloride and then the rate of etching was measured while using the metals remaining on the polyimide resin as a substitute for a protective film of a resist and the like. It was possible to remove the polyimide resin layer completely after five minutes of immersion; however, when observed by an SEM, the section of the polyimide resin layer was found to be extremely uneven in shape and, in addition, overetching of the layer of polyimide resin A produced an undercut in the layer of polyimide resin K.

COMPARATIVE EXAMPLE 2

A double-sided laminate was prepared as in Example 1 except using the polyimide precursor L prepared in Synthetic Example 2 and the polyimide precursor A prepared in Synthetic Example 1.

The rate of etching of the laminate was measured as in Comparative Example 1. The processing was impossible as the residue of swollen polyimide resin remained on the stainless steel foil even after 20 minutes of immersion.

COMPARATIVE EXAMPLE 3

The preparation of a double-sided laminate was attempted as in Example 1 except using the polyimide precursor M prepared in Synthetic Example 2 and the polyimide precursor A prepared in Synthetic Example 1, but it was impossible to bond a copper foil to the laminate by thermocompression even at 390° C.

COMPARATIVE EXAMPLE 4

A double-sided laminate was prepared as in Example 1 except using the polyimide precursor P prepared in Synthetic Example 2 and the polyimide precursor A prepared in Synthetic Example 1. The rate of etching of the laminate was measured as in Comparative Example 1. However, it required some time to etch the residue of the layer of polyimide resin P completely and the time required for wet etching of the polyimide resin layer was 7 minutes 20 seconds. Moreover, the shape at the edge of the etched surface of polyimide resin was irregular and an undercut produced by overetching was observed in the layer of polyimide resin P.

COMPARATIVE EXAMPLE 5

A double-sided laminate was prepared as in Example 1 except using the polyimide precursor S prepared in Synthetic Example 2 and the polyimide precursor A prepared in Synthetic Example 1. The rate of etching of the laminate was measured as in Comparative Example 1. The residue of the layer of polyimide resin T was observed on the SUS foil even after 30 minutes of immersion and the processing was impossible to perform because of incomplete etching.

COMPARATIVE EXAMPLE 6

A double-sided laminate was prepared as in Example 1 except using the polyimide precursor R prepared in Synthetic Example 2 and the polyimide precursor C prepared in Synthetic Example 1.

The rate of etching of the laminate was measured as in Comparative Example 1. The processing was impossible to perform because etching was not complete even after 30 minutes of immersion and the polyimide resin swelled markedly

INDUSTRIAL APPLICABILITY

This invention provides a laminate whose insulating polyimide layer can be processed by etching with an aqueous solution of alkali metal hydroxide on a commercial scale. The laminate of this invention shows little dimensional change, good heat resistance and sufficient bonding strength to metal foils as it contains a polyimide resin layer of low CTE. The laminate leads to improvement in solder heat resistance and to suppression of dimensional change during a heat treatment and is suitable for use in the substrates for flexible printed circuits and HDD suspensions.

What is claimed is:

1. A laminate comprising a metal foil and an insulating resin layer,
   wherein the insulating resin layer comprises (1) at least one polyimide resin layer (A) of low thermal expansion with a coefficient of linear thermal expansion of $30 \times 10^{-6}/°$ C. or less and (2) at least one polyimide resin layer (B) with a glass transition temperature of 300° C. or below,
   wherein the metal foil is in contact with the polyimide resin layer (B) and the bonding strength between the metal foil and the polyimide resin layer (B) in contact therewith is 0.5 kN/m or more,
   wherein the polyimide resin layer (B) intervenes between the metal foil and the polyimide resin layer (A),
   wherein the average rate of etching of the insulating resin layer by a 50 wt % aqueous solution of potassium hydroxide at 80° C. is 0.5 μm/min or more,
   wherein the insulating resin layer comprises a ratio in thickness of polyimide resin layer (A)/polyimide resin layer (B) in the range of 2-100 based on the total polyimide resin layers constituting the insulating resin layer,
   wherein the polyimide resin layer (A) comprises a rate of etching 1 to 30 times that of the polyimide resin layer (B) in contact with the metal foil,
   wherein the rates of etching of the polyimide resin layers (A) and (B) by a 50 wt % aqueous solution of potassium hydroxide at 80° C. is 2 μm/min or more and 0.5 μm/min or more, respectively,
   wherein the polyimide resin layer (B) comprises a polyimide resin obtained by the reaction of a diamine with a tetracarboxylic acid dianhydride, and
   wherein 50 mol % or more of the diamine in use is at least one kind of diamine selected from the group consisting of 2,4-diaminotoluene, 1,3-bis(3-aminophenoxy)benzene, 4,4'-diamino-2'-methoxybenzanilide, and diamines represented by the following general formula (2)

(2)

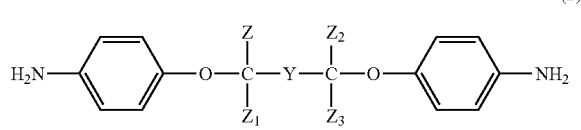

wherein Z-Z3 are independently hydrogen atoms and alkyl groups containing 1-3 carbon atoms and Y is a divalent straight-chain or branched aliphatic hydrocarbon group containing 1-5 carbon atoms and optionally a substituent.

2. The laminate as described in claim 1, wherein the insulating resin layer comprises an outermost polyimide resin layer (B) on each side of the laminate, wherein each of said outermost polyimide resin layer (B) is in contact with a metal foil, and wherein at least one of the metal foils is a copper foil.

3. The laminate as described in claim 1,
wherein 50 mol % or more of the tetracarboxylic acid dianhydride in use is at least one kind of tetracarboxylic acid dianhydride selected from the group consisting of pyromellitic dianhydride, 3,4,3',4'-benzophenonetetracarboxylic acid dianhydride, 3,4,3',4'-diphenylsulfonetetracarboxylic acid dianhydride and tetracarboxylic acid dianhydrides represented by the following general formula (1)

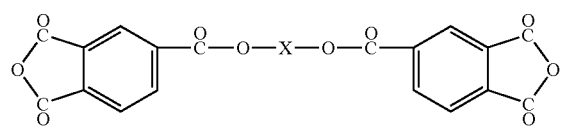

(1)

wherein X is a divalent straight-chain or branched aliphatic hydrocarbon group containing 2-30 carbon atoms and optionally a substituent.

4. A method for manufacturing the laminate described in claim 1, which comprises
(a) applying a solution of polyimide resin or precursor thereof to the surface of a metal foil followed by drying to form a layer which is to form the polyimide resin layer (B) with a glass transition temperature of 300° C. or below,
(b) applying onto the solution or the formed polyimide resin layer (B) of step (a) a solution of polyimide resin or precursor thereof followed by drying to form a layer which is to form the polyimide resin layer (A) of low thermal expansion with a coefficient of linear expansion of $30 \times 10_6/°$ C. or less, and
(c) subjecting the arranged layers to a heat treatment at a temperature above 200° C.,
wherein the formed polyimide resin layer (B) intervenes between the metal foil and the formed polyimide resin layer (A),
wherein the insulating resin layer comprises a ratio in thickness of polyimide resin layer (A)/polyimide resin layer (B) in the range of 2-100 based on the total polyimide resin layers constituting the insulating resin layer, and wherein the polyimide resin layer (A) comprises a rate of etching 1 to 30 times that of the polyimide resin layer (B) in contact with the metal foil.

5. The method as described in claim 4, further comprising, after step (b), applying onto the solution or the formed polyimide resin layer (A) of step (b) a solution of polyimide resin or precursor thereof followed by drying to form a layer which is to form an outermost polyimide resin layer (B).

6. The method as described in claim 5, further comprising placing a metal foil on the outermost polyimide resin layer (B) of the laminate and subjecting the resulting laminate to thermocompression bonding to form a laminate having metal foils on both sides.

7. A method for manufacturing a laminate which comprises
obtaining two laminates produced by the method described in claim 5, each said laminate having an outermost polyimide resin layer (B) on one of its surfaces,
arranging said two laminates with their outermost polyimide resin layers (B) facing each other, and
subjecting the resulting laminate to thermocompression bonding to form a laminate having metal foils on both sides,
wherein the polyimide resin layer (B) comprises a polyimide resin obtained by the reaction of a diamine with a tetracarboxylic acid dianhydride, and
wherein 50 mol % or more of the diamine in use is at least one kind of diamine selected from the group consisting of 2,4-diaminotoluene, 1,3-bis(3-aminophenoxy)benzene, 4,4'-diamino-2'-methoxybenzanilide, and diamines represented by the following general formula (2)

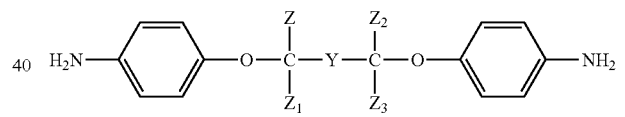

(2)

wherein Z-Z3 are independently hydrogen atoms and alkyl groups containing 1-3 carbon atoms and Y is a divalent straight-chain or branched aliphatic hydrocarbon group containing 1-5 carbon atoms and optionally a substituent.

8. A method for manufacturing a laminate which comprises
obtaining two laminates produced by the method described in claim 5, each said laminate having an outermost polyimide resin layer (B) on one of its surfaces,
placing a film which is to form a polyimide resin layer (A) between said two laminates with the outermost polyimide resin layers (B) of each laminate facing the film, and
subjecting thereto to thermocompression bonding to form a laminate,
wherein the polyimide resin layer (B) comprises a polyimide resin obtained by the reaction of a diamine with a tetracarboxylic acid dianhydride, and
wherein 50 mol% or more of the diamine in use is at least one kind of diamine selected from the group consisting of 2,4-diaminotoluene, 1,3-bis(3-aminophenoxy)benzene, 4,4'-diamino-2-methoxybenzanilide, and diamines represented by the following general Formula (2)

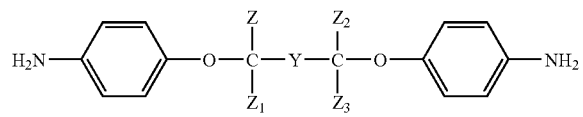

(2)

wherein Z-Z3 are independently hydrogen atoms and alkyl groups containing 1,3 carbon atoms and Y is a divalent straight-chain or branched aliphatic hydrocarbon group containing 1-5 carbon atoms and optionally a substituent.

9. A method for manufacturing a laminate which comprises
obtaining two laminates produced by the method described in claim 4, each said laminate having an polyimide resin layer (A) on one of its surface,
arranging said two laminates with their polyimide resin layers (A) facing each other, and
subjecting the resulting laminate to thermocompression bonding to form a laminate having metal foils on both sides,
wherein the polyimide resin layer (A) comprises a polyimide resin obtained by the reaction of a diamine with a tetracarboxylic acid dianhydride,
wherein 60 mol % or more of the tetracarboxylic acid dianhydride in use is pyromellitic dianhydride, and
wherein the diamine in use comprises at least 4,4'-diamino-2'-methoxybenzanilide.

10. A method for processing a laminate which comprises
etching the metal foil of the laminate described in claim 1 in a specified pattern,
forming a resist layer of a specified pattern on a portion of the surface of the insulating layer located directly under the pattern etched in the metal foil, and
etching the insulating layer in a specified pattern by a 5-80 wt % aqueous solution of alkali metal hydroxide at 50° C. or above.

11. A method of manufacturing a polyimide-based laminated film which comprises
applying a solution of precursor resin or resin which is to form a polyimide resin layer (B) with a glass transition temperature of 300° C. or below to both sides of the polyimide resin film of low thermal expansion with a coefficient of linear expansion of $30 \times 10^{-6}$/° C. or less, followed by
drying to form a polarity of layers, and
subjecting the layers to heat treatment at a high temperature above 200° C. to form a laminated polyimide film which shows an average rate of etching of 0.5 µm/min or more by a 50 wt % aqueous solution of potassium hydroxide at 80° C.
wherein the polyimide resin layer (B) comprises a polyimide resin obtained by the reaction of the diamine with a tetracarboxylic acid dianhydride, and
wherein 50 mol % or more of the diamine in use is at least one kind of diamine selected from a group consisting of 2,4-diaminotoluene, 1,3-bis(3-aminophenoxy)benzene, 4,4'-diamino-2'-methoxybenzanilide, and diamines represented by the following general formula (2)

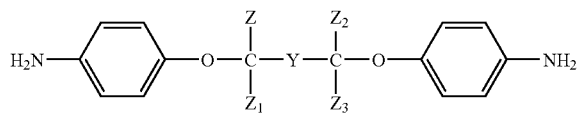

(2)

wherein Z-Z3 are independently hydrogen atoms and alkyl groups containing 1-3 carbon atoms and Y is a divalent straight-chain or branched aliphatic hydrocarbon group containing 1-5 carbon atoms and optionally a substituent.

12. A laminate comprising a metal foil and an insulating resin layer,
wherein the insulating resin layer comprises (1) at least one polyimide resin layer (A) of low thermal expansion with a coefficient of linear thermal expansion of $30 \times 10_{31\ 6}$ /° C. or less and (2) at least one polyimide resin layer (B) with a glass transition temperature of 300° C. or below,
wherein the metal foil is in contact with the polyimide resin layer (B) and the bonding strength between the metal foil and the polyimide resin layer (B) in contact therewith is 0.5 kN/m or more,
wherein the polyimide resin layer (B) intervenes between the metal foil and the polyimide resin layer (A),
wherein the average rate of etching of the insulating resin layer by a 50 wt % aqueous solution of potassium hydroxide at 80° C. is 0.5 µm/min or more,
wherein the insulating resin layer comprises a ratio in thickness of polyimide resin layer (A)/polyimide resin layer (B) in the range of 2-100 based on the total polyimide resin layers constituting the insulating resin layer,
wherein the polyimide resin layer (A) comprises a rate of etching 1 to 30 times that of the polyimide resin layer (B) in contact with the metal foil,
wherein the rates of etching of the polyimide resin layers (A) and (B) by a 50 wt % aqueous solution of potassium hydroxide at 80° C. is 2 µm/min or more and 0.5 µm/mm or more, respectively,
wherein the polyimide resin layer (B) comprises a polyimide resin obtained by the reaction of a diamine with a tetracarboxylic acid dianhydride,
wherein 50 mol % or more of the tetracarboxylic acid dianhydride in use is at least one kind of tetracarboxylic acid dianhydride selected from the group consisting of pyromellitic dianhydride, 3,4,3',4'-benzophenonetetracarboxylic acid dianhydride, 3,4,3',4'-diphenylsulfonetetracarboxylic acid dianhydride and ethylene glycol bis(dianhydride and ethylene glycol bis (anhydro-trimellitate), and
wherein 50 mol % or more of the diamine in use is a mixture of 1,3-bis(3-aminophenoxy)benzene and another diamine selected from the group consisting of p-phenylenediamine, 3,4'-diaminodiphenyl ether and 1,3-bis(4-aminophenoxy)-2,2-dimethylpropane.

13. The laminate as described in claim 12, wherein 50 mol % or more of the tetracarboxylic acid dianhydride in use is (a) a mixture of pyromellitic dianhydride and 3,4,3',4'-benzophenonetetracarboxylic acid dianhydride, or (b) a mixture of pyromellitic dianhydride and 3,4,3',4'-diphenylsulfonetetracarboxylic acid dianhydride.

14. The laminate as described in claim 12, wherein 50 mol % or more of the tetracarboxylic acid dianhydride in use is a mixture of pyromellitic dianhydride and 3,4,3',4'-diphenylsulfonetetracarboxylic acid dianhydride, and wherein 50 mol % or more of the diamine in use is a mixture of p-phenylenediamine and 1,3-bis(3-aminophenoxy)benzene.

15. The laminate as described in claim 12, wherein 50 mol % or more of the tetracarboxylic acid dianhydride in use is a mixture of pyromellitic dianhydride and ethylene glycol bis(anhydro-trimellitate), and wherein 50 mol % or more of the diamine in use is a mixture of p-phenylenediamine and 1,3-bis(3-aminophenoxy)benzene.

16. A laminate comprising a metal foil and an insulating resin layer,
   wherein the insulating resin layer comprises (1) at least one polyimide resin layer (A) of low thermal expansion with a coefficient of linear thermal expansion of $30 \times 10_6/°$ C. or less and (2) at least one polyimide resin layer (B) with a glass transition temperature of 300° C. or below,
   wherein the metal foil is in contact with the polyimide resin layer (B) and the bonding strength between the metal foil and the polyimide resin layer (B) in contact therewith is 0.5 kN/m or more,
   wherein the polyimide resin layer (B) intervenes between the metal foil and the polyimide resin layer (A),
   wherein the average rate of etching of the insulating resin layer by a 50 wt % aqueous solution of potassium hydroxide at 80° C. is 0.5 μm/min or more,
   wherein the insulating resin layer comprises a ratio in thickness of polyimide resin layer (A)/polyimide resin layer (B) in the range of 2-100 based on the total polyimide resin layers constituting the insulating resin layer,
   wherein the polyimide resin layer (A) comprises a rate of etching 1 to 30 times that of the polyimide resin layer (B) in contact with the metal foil,
   wherein the rates of etching of the polyimide resin layers (A) and (B) by a 50 wt % aqueous solution of potassium hydroxide at 80° C. is 2 μm/min or more and 0.5 μm/min or more, respectively,
   wherein the polyimide resin layer (A) comprises a polyimide resin obtained by the reaction of a diamine with a tetracarboxylic acid dianhydride,
   wherein 60 mol % or more of the tetracarboxylic acid dianhydride in use is pyromellitic dianhydride, and
   wherein the diamine in use comprises at least 4,4'-diamino-2'-methoxybenzanilide.

17. The laminate as described in claim 16, wherein 50 mol % or more of the tetracarboxylic acid dianhydride in use is (a) a mixture of pyromellitic dianhydride and 3,4,3',4'-benzophenonetetracarboxylic acid dianhydride, or (b) a mixture of pyromellitic dianhydride and 3,4,3',4'-diphenylsulfonetetracarboxylic acid dianhydride.

18. The laminate as described in claim 16, wherein 50 mol % or more of the tetracarboxylic acid dianhydride in use is a mixture of pyromellitic dianhydride and 3,4,3',4'-benzophenonetetracarboxylic acid dianhydride, and wherein 50 mol % or more of the diamine in use is either (a) p-phenylenediamine, 1,3-bis(3-aminophenoxy)benzene, 3,4-diaminodiphenyl ether or 1,3-bis(4-aminophenoxy)-2,2-dimethylpropane, or (b) a mixture of two diamines selected from the group consisting of p-phenylenediamine, 1,3-bis(3-aminophenoxy)benzene, 3,4-diaminodiphenyl ether and 1,3-bis(4-aminophenoxy)-2,2-dimethylpropane.

19. The laminate as described in claim 16, wherein 50 mol % or more of the tetracarboxylic acid dianhydride in use is a mixture of pyromellitic dianhydride and 3,4,3',4'-diphenylsulfonetetracarboxylic acid dianhydride, and wherein 50 mol % or more of the diamine in use is a mixture of p-phenylenediamine and 1,3-bis(3-aminophenoxy)benzene.

20. The laminate as described in claim 16, wherein 50 mol % or more of the tetracarboxylic acid dianhydride in use is a mixture of pyromellitic dianhydride and ethylene glycol bis(anhydro-trimellitate), and wherein 50 mol % or more of the diamine in use is a mixture of p-phenylenediamine and 1,3-bis(3-aminophenoxy)benzene.

* * * * *